(12) United States Patent
Wu et al.

(10) Patent No.: US 7,788,309 B2
(45) Date of Patent: Aug. 31, 2010

(54) INTERLEAVED COMB AND INTEGRATOR FILTER STRUCTURES

(75) Inventors: Lu Wu, Greensboro, NC (US); Ken Gentile, Bahama, NC (US)

(73) Assignee: Analog Devices, Inc., Norwood, MA (US)

( * ) Notice: Subject to any disclaimer, the term of this patent is extended or adjusted under 35 U.S.C. 154(b) by 1184 days.

(21) Appl. No.: 11/398,213

(22) Filed: Apr. 4, 2006

(65) Prior Publication Data

US 2007/0230642 A1  Oct. 4, 2007

(51) Int. Cl.
*G06F 17/17* (2006.01)
(52) U.S. Cl. .................................................. 708/313
(58) Field of Classification Search ................. 708/313
See application file for complete search history.

(56) References Cited

U.S. PATENT DOCUMENTS

| | | | | |
|---|---|---|---|---|
| 4,999,798 A | * | 3/1991 | McCaslin et al. ............ | 708/313 |
| 5,517,529 A | * | 5/1996 | Stehlik ........................ | 375/316 |
| 6,501,406 B1 | | 12/2002 | Mecchia ..................... | 341/143 |
| 6,559,781 B2 | | 5/2003 | Freidhof ...................... | 341/61 |
| 6,643,675 B2 | | 11/2003 | Piirainen .................... | 708/313 |
| 6,707,255 B2 | | 3/2004 | Coumou et al. ......... | 315/111.41 |
| 6,788,233 B1 | | 9/2004 | Quiquempoix ............. | 341/143 |
| 6,831,900 B2 | | 12/2004 | Blake ......................... | 370/289 |
| 6,871,207 B1 | * | 3/2005 | Nanda et al. ................ | 708/313 |
| 7,170,959 B1 | * | 1/2007 | Abbey ........................ | 375/350 |
| 7,196,648 B1 | * | 3/2007 | Ding et al. .................. | 341/144 |
| 2005/0160124 A1 | * | 7/2005 | Bisiaux ...................... | 708/300 |

OTHER PUBLICATIONS

Babic et al., Decimation by Irrational Factor Using CIC Filter and Linear Interpolation, IEEE 2001, pp. 3667-3680.*
Donadio, Matthew P., "CIC Filter Introduction", pp. 1-6, Iowegian Free Publication available at dspguru.com, Jul. 18, 2000.
Cascaded Integrator-Comb (CIC) Filter, product specification, pp. 1-18, Xilinx, Inc., San Jose, CA, Mar. 14, 2002.
Lyons, Richard, "Understanding Cascaded Integrator-comb Filters", Embedded Systems Design Magazine, pp. 1-11, Mar. 31, 2005.

* cited by examiner

*Primary Examiner*—Chuong D Ngo
(74) *Attorney, Agent, or Firm*—Koppel, Patrick, Heybl & Dawson

(57) ABSTRACT

Filter system embodiments are provided for realizing interpolation and decimation processes with interleaved filter structures. These interleaved structures enable the systems to obtain output data rates that exceed the highest operation rates of the system components.

14 Claims, 4 Drawing Sheets

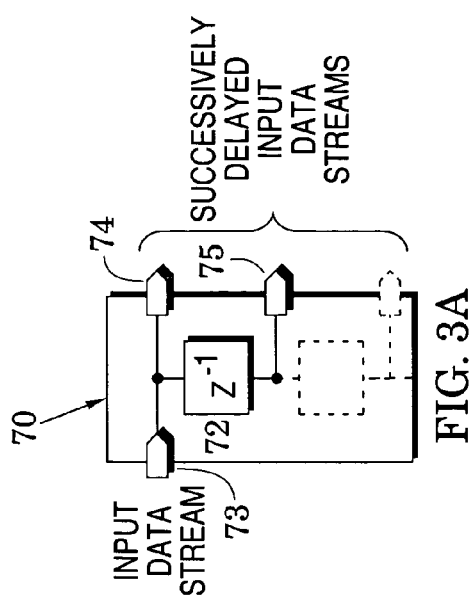

US 7,788,309 B2

INTERLEAVED COMB AND INTEGRATOR FILTER STRUCTURES

BACKGROUND OF THE INVENTION

1. Field of the Invention

The present invention relates generally to digital filters.

2. Description of the Related Art

In the processing of digital signals, it is often advantageous to change from a first data rate suitable for a first network of digital circuits to a different second data rate that is suitable for a subsequent second network. If the second data rate is less than the first, the rate change is typically called decimation which comprises a filtering process configured to reduce aliasing followed by a downsampling process to effect the rate change. If the second data rate is greater than the first, the rate change is typically called interpolation which comprises an upsampling process to effect the rate change followed by a filtering process configured to reduce images.

FIG. 1 illustrates an exemplary interpolator system 20 in which an input data stream having an element x(n) at an input port 21 is upsampled by a symbolic switch 23 that increases the data rate by a factor R wherein R is an integer. The upsampled data stream is then filtered by a digital filter 24 that is configured to reduce images in an output data stream having an element y(n) at an output port 25.

In systems that process data at high rates, it is extremely important that the structure of the digital filter 24 is configured to reduce computational complexity. For this purpose, it has been found that a particularly advantageous version of the filter 24 is the combination of a comb filter 31 and a subsequent integrator filter 32 which are shown with their transfer functions in the filter system 30. These filters essentially perform a recursive running-sum process on the upsampled data stream out of the switch 23 wherein the comb filter 31 provides a moving sum and the integrator filter 32 provides an average of this sum.

The filter system 30 is significantly simplified by interchanging the comb filter and the switch as shown in the filter system 40. Because this interchange translates the comb filter to the low rate portion of the filter system, the differential delay R of the comb filter 31 in the system 30 reduces to 1 so that it is becomes a simple differentiator 41 in the system 40. That is, a 1-sample delay before upsampling by R is equivalent to an R-sample delay after the upsampling.

FIG. 1B shows that the transfer function of the comb filter 41 of FIG. 1A can be realized with an adder 43 that differences each data stream element x(n) with a delayed data stream element x(n−1) that is provided when the input data stream passes through a delay register 44. FIG. 1B also shows that the transfer function of the integrator filter 32 of FIG. 1A can be realized with an adder 45 that provides each output data stream element y(n) by summing an input data stream element x(n) with a delayed data stream element y(n−1) that is generated by feeding the output data stream back through another delay register 44.

The comb filter 41 thus subtracts a delayed data stream element from the current input data stream element whereas the integrator filter 32 is an accumulator that adds the current input data stream element to the previous output data stream element. Accordingly, the comb filter has a feed-forward structure and the integrator filter has a feed-back structure.

The filter system 40 of FIG. 1A is generally referred to as cascaded comb-integrator (CIC) filter which is especially suited for effecting a rate change from an initial data rate to a higher data rate while preserving the spectral characteristics of the input data stream and suppressing spectral images that are generated by the rate change. From the filter structure shown in FIG. 1B, it is apparent that the only arithmetic needed to implement a CIC filter is addition and subtraction. In addition, the above-described interchange of the comb filter and the switch significantly reduces the required data storage. Accordingly, CIC filters are particularly suited for use in a wide range of digital signal processing systems.

When these filters are required, however, to operate at ever-higher data rates it is generally found that integrated circuit implementations of CIC filters run into problems. For example, data timing problems become excessively problematical and filter dissipation rises because, at these higher rates, the filter adders must be realized with pipelined adder structures that substantially increase fabrication costs and system heating.

BRIEF SUMMARY OF THE INVENTION

The present invention is directed to interleaved comb and integrator filter systems that enhance filter performance. The novel features of the invention are set forth with particularity in the appended claims. The invention will be best understood from the following description when read in conjunction with the accompanying drawings.

BRIEF DESCRIPTION OF THE DRAWINGS

FIGS. 3A-3C are block diagrams of filter structures in an input filter section of the system of FIG. 2;

DETAILED DESCRIPTION OF THE INVENTION

Figure 2:
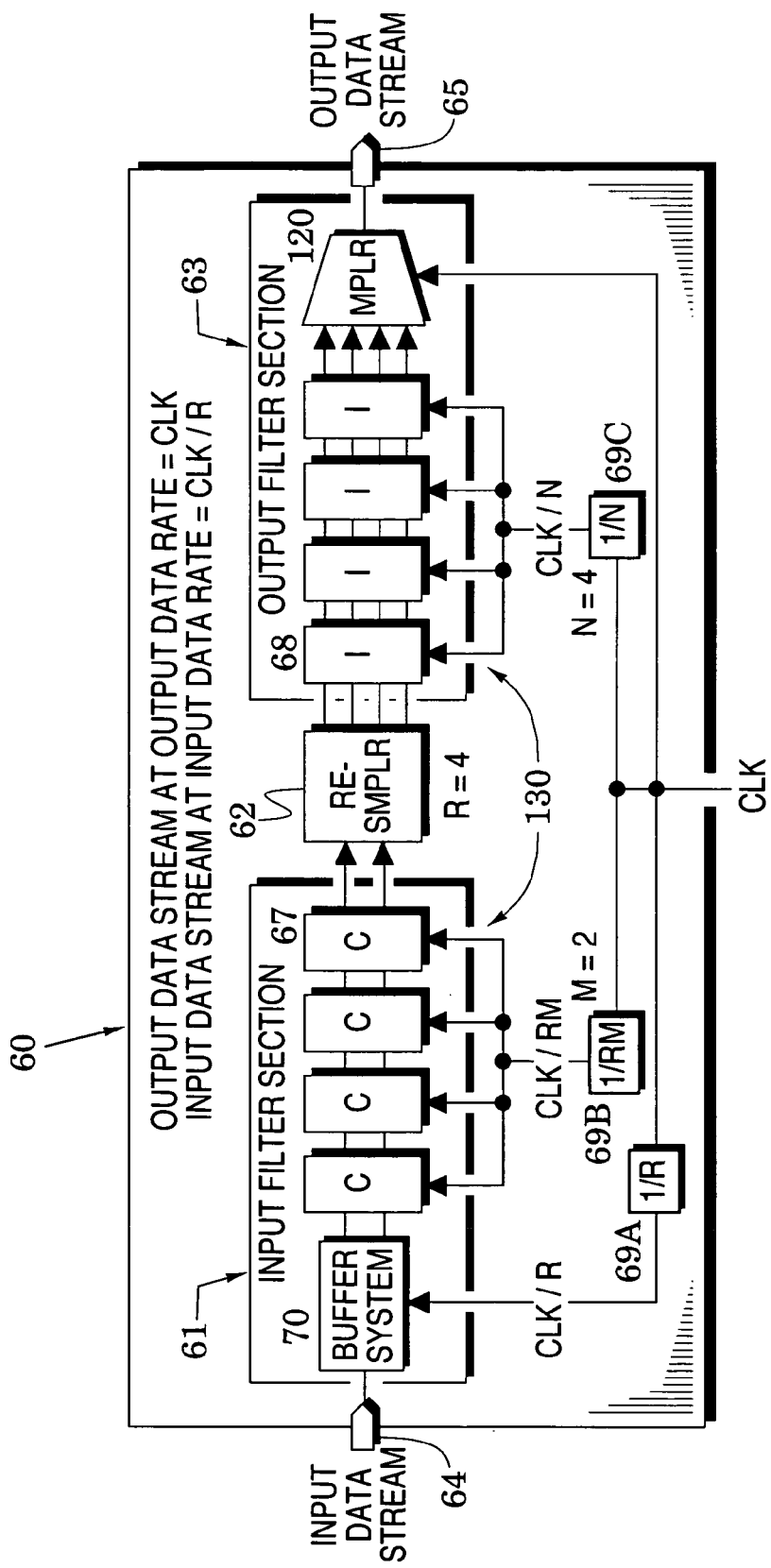
FIG. 2 is a block diagram of a filter system embodiment of the present invention.

FIG. 2 illustrates a filter system embodiment 60 of the invention that processes an input data stream at an input data rate into an output data stream at an output data rate that exceeds the input data rate by a factor R. Although the system 60 thus performs an interpolation process, it realizes it with an interleaved structure that can generate the output data rate even when this rate is higher than the rates of which the system components are capable.

In particular, the system 60 serially couples an input filter section 61, a resampler 62, and an output filter section 63 between an input port 64 and an output port 65. An input data stream is received at the input port 61 and the system 60 processes this stream into an output data stream at the output port 65. As stated above, the input data stream has an input data rate and the output data stream has an output data rate that is greater than the input data rate. In particular, the output data rate is at a clock (clk) rate and the input data rate is at a rate of clk/R wherein R is an integer.

To effect this interpolation process, the filter system 60 has a CCI arrangement in which the input filter section 61 is formed with comb structures 67 (each denoted with a C) and the output filter section 63 is formed with integrator structures 68 (each denoted with an I). Data storage in the comb structures is significantly simplified by positioning them at the lower data rate portion of the system. In contrast, the integrator structures follow the resampler and, accordingly, process the higher data rates of the system.

As the demands of modern signal processing require higher and higher data rates, it has been found that filter rates approach or exceed those at which digital gates (e.g., complementary metal-oxide-semiconductor (CMOS) gates) can reliably operate. To resolve this problem, the filter system 20 configures the output filter section 63 so that it interleavably processes resampled data streams from the resampler over N integrator processing paths to thereby provide the output data stream. Because the output filter section processing is interleavably carried out over N processing paths, each path can operate at the reduced rate of clk/N.

Although the processing demand is not as severe in the input filter section 61 (because it processes the lower-rate input data stream), it may also be configured to interleavably process the input data streams over M integrator processing paths to thereby provide M intermediate data streams to the resampler 62. Because the input filter processing is interleavably carried out over M processing paths, each path can operate at the reduced rate of clk/RM.

To facilitate the interleaved processing of the input filter section 61, it has a buffer system 70 which provides successively-delayed input data streams at a data rate of clk/R. In addition, the resampler 62 is configured to convert the M intermediate data streams from the input filter section 61 into N successively-delayed resampled data streams which are provided to the output filter section 63. The intermediate data streams have an intermediate data rate of clk/RM and the resampled data streams have a resampled data rate of clk. The integrator structures operate at the rate clk/N. Dividers 69A, 69B and 69C are provided to divide the clk signal and provide the required clock signals clk/R, clk/RM and clk/N.

Figure 1:
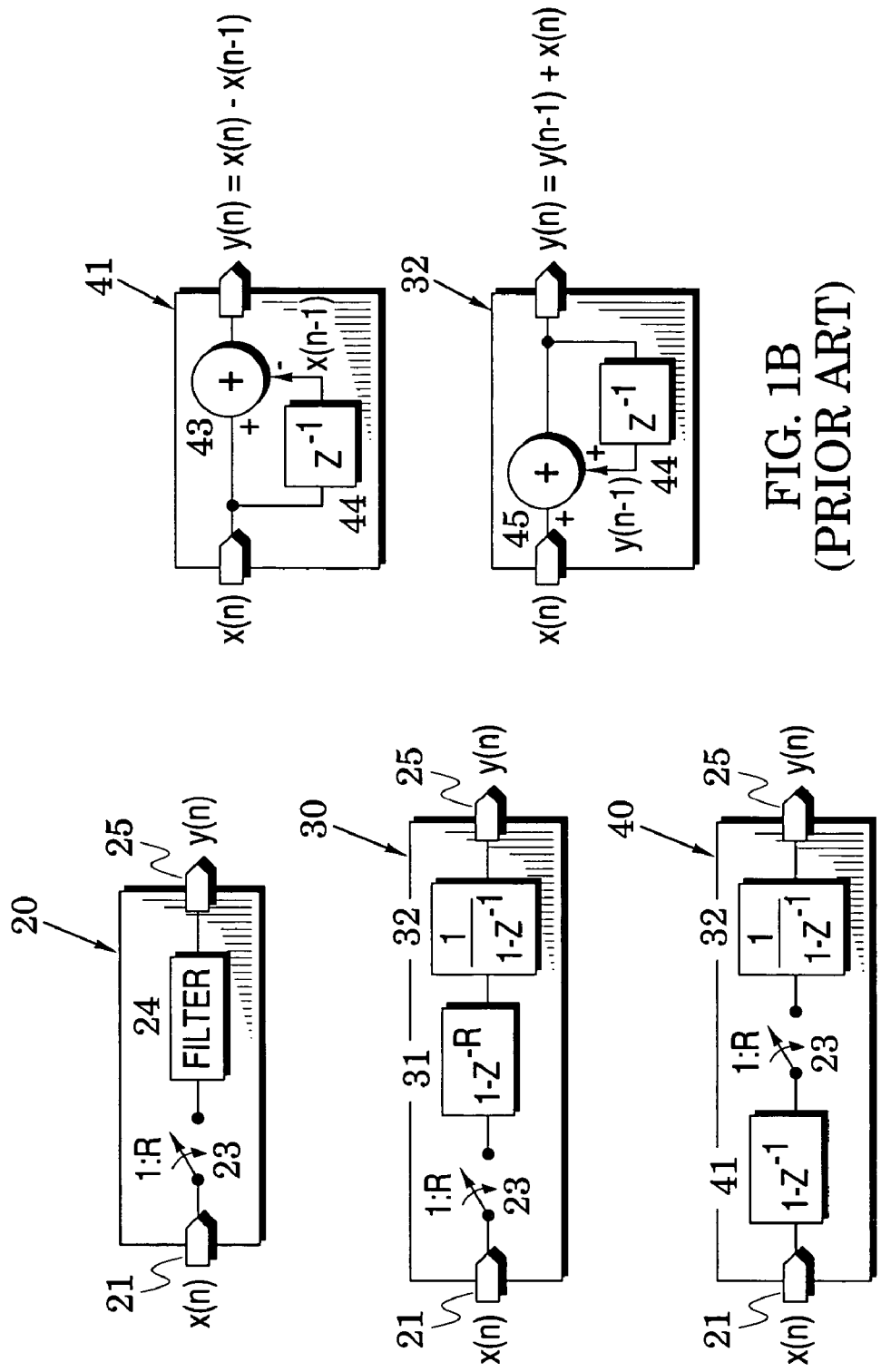
FIGS. 1A and 1B are block diagrams of exemplary interpolator structures.

In the filter system 20, therefore, processing rate in the comb structures 67 is reduced by a factor M and processing rate in the integrator structures 68 is reduced by a factor N. In the exemplary system embodiment of FIG. 1, R=4, M=2, and N=4. To describe embodiments of the input and output filter sections, attention is initially directed to FIG. 3A which illustrates a buffer system 70 and to FIGS. 3B and 3C which illustrate exemplary interleaved comb structures 80 and 90.

The buffer system 70 of FIG. 3A includes at least one delay register 72 (others are shown in broken lines). The input data stream is coupled from an input port 73 to an output port 74 and coupled through a string of the delay registers to other output ports 75 to thereby provide successively-delayed input data streams. Each of the delay registers operates at the data rate of clk/R. When the buffer system 70 is used in the filter system 60 of FIG. 2, it receives the input data stream from the input port 64 and provides successively-delayed input data streams to the comb structures 67.

FIG. 3B illustrates a comb structure 80 which has two interleaved processing paths that begin at two input ports 81 and 82 which receive successively-delayed input data streams (e.g., from the buffer system 70 of FIG. 3A). The input data streams are represented by data elements x(n) and x(n−1) wherein x(n−1) precedes x(n) in the input data stream at the input port 73 of FIG. 3A.

A first summer 83 is arranged to difference elements of the data stream at the port 81 with elements of the delayed data stream at the port 82 to thereby provide an output element y(n) at an output port 84 wherein y(n)=x(n)−x(n−1). The first summer 83 thus subtracts a delayed data stream element from the current input data stream element which is the comb process performed by the comb filter 40 of FIG. 1B.

In order to interleavably process elements of the delayed data stream at the port 82, further delayed elements (e.g., x(n−2)) must be available. Accordingly, the comb structure 80 includes a delay register 85 which is coupled to the port 81 to provide data stream elements x(n−2) that are differenced with delayed data stream elements x(n−1) in a second summer 86. The difference provides an output element y(n−1) at an output port 87 wherein y(n−1)=x(n−1)−x(n−2). Thus, elements x(n) and x(n−1) of a data stream at the input port 81 and a delayed data stream at the input port 82 are interleavably processed into elements y(n) and y(n−1) of intermediate data streams at the output ports 84 and 87.

Referring to FIG. 2, it is important to note that the buffer system 70 provides successively-delayed data streams having a data rate of clk/R but each comb structure 67 operates at the lower data rate clk/RM. Since M=2 in the comb structure 80 of FIG. 3B, the summers 83 and 86 and the delay register 85 operate at one half the rate of the data streams at the input ports 81 and 82. Accordingly, the delay register 85 provides a data stream element x(n−2) when a data stream element x(n) is present at the input port 81.

Although the comb structure 80 of FIG. 3B is suited for use in the filter system 60 of FIG. 2, a similar comb structure 90 is shown in FIG. 3C to more clearly illustrate interleaved comb arrangement embodiments of the invention. The comb structure 90 is suited for processing of three interleaved data streams, i.e., suited for a filter system in which M in FIG. 2 is 3 rather than 2.

The comb structure 90 includes elements of the comb structure 80 with like elements indicated by like reference numbers. In addition, the comb structure 90 adds a third input port 91 and a third output port 92 and moves the output of the delay register 85 down to a third summer 93 which is coupled between the added ports 91 and 92. Thus, the second delay register 85 continues to receive data stream elements x(n) from the input port 81 but, because M is now 3, the delay register 85 provides delayed data stream elements x(n−3).

Therefore, the first summer 83 differences an element x(n) of the data stream at the port 81 with an element x(n−1) of the delayed data stream at the port 82 to provide an output element y(n)=x(n)−x(n−1) at the output port 84 and summer 86 differences an element x(n−1) of the delayed data stream at the port 82 with an element x(n−2) of the further-delayed data stream at the port 91 to provide an output element y(n−1)=x(n−1)−x(n−2) at the output port 87. Finally, the added summer 93 differences the element x(n−2) at the input port 91 with the delayed data stream element x(n−3) from the delay register 85 to provide an output element y(n−2)=x(n−2)−x(n−3) at the added output port 92.

From FIGS. 3B and 3C, it is apparent that an interleaved comb structure embodiment of the invention generally includes:

a) a register coupled to delay a first one of M successively-delayed input data streams into a delayed input data stream; and b) a network of summers wherein:

1) M−1 of the summers are each arranged to difference a respective one of the M successively-delayed input data streams with the next-delayed one of the M successively-delayed input data streams to thereby provide a respective one of M intermediate data streams; and 2) one of the summers is arranged to difference the most-delayed one of the M successively-delayed input data streams with the delayed input data stream to thereby provide an Mth one of the intermediate data streams.

Figure 4:
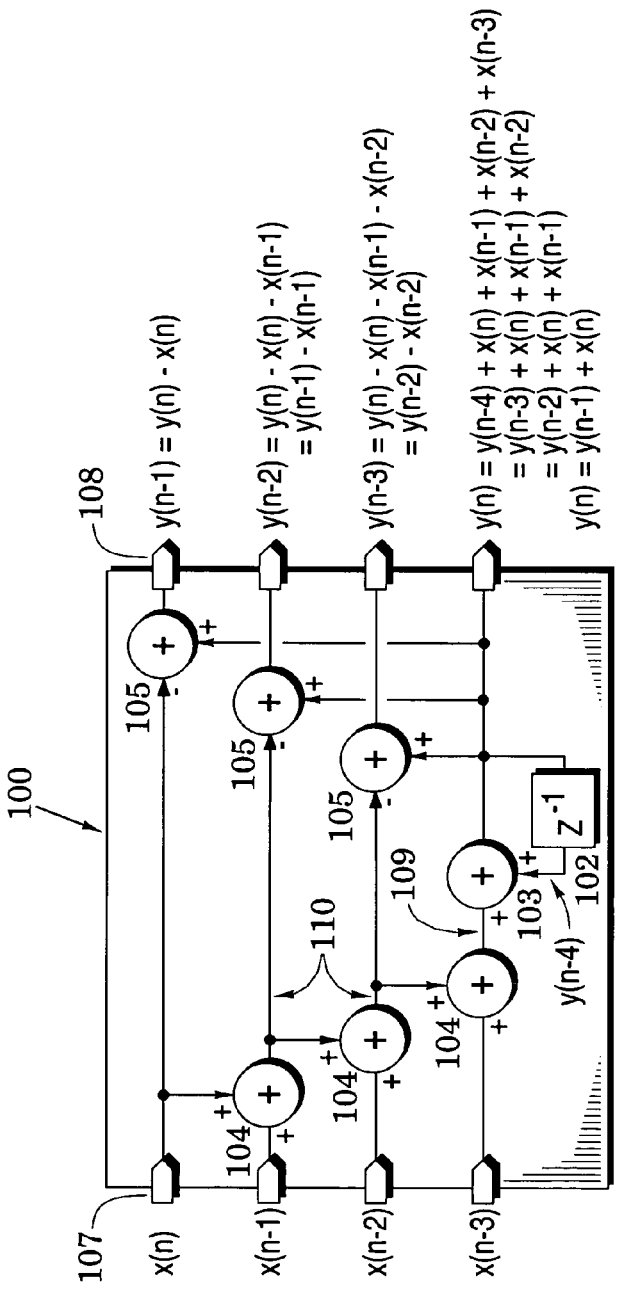
FIG. 4 is a block diagram of filter structures in an output filter section of the system of FIG. 2.

Attention is now directed to FIG. 4 which illustrates an integrator structure embodiment 100 which can be used in each of the integrator structures 68 of FIG. 2. The embodiment 100 is configured to interleavably process N successively-delayed resampled data streams (e.g., from the resampler 62 of FIG. 2) into N filtered data streams. In particular, elements x(n), x(n−1), x(n−2) and x(n−3) of the successively-delayed resampled data streams are received at input ports 107 and elements y(n), y(n−1), y(n−2) and y(n−3) of the filtered data streams are provided at output ports 108. The integrator embodiment comprises a delay register 102 and a network of summers that include a first summer 103, N−1 summers 104 and N−1 summers 105.

The delay register 102 is coupled to the Nth one of the output ports 108 to provide a delayed version of the filtered data stream at that output port. In the system 60 of FIG. 2, it is noted that the resampler 62 provides successively-delayed data streams having a data rate of clk but each integrator structure 68 operates at the lower data rate clk/N. Since N=4 in the integrator structure 100 of FIG. 4, the delay register 102 and summers 103, 104 and 105 operate at one fourth the rate of the data streams at the input ports 107. Accordingly, the delay register 102 provides a data stream element y(n−4) when a data stream element y(n) is present at one of the output ports 108. In this manner, the delay register 102 provides elements of a delayed filtered data stream.

The N−1 summers 104 are arranged to provide a sum 109 of the elements of the resampled data streams at the input ports 107 and the summer 103 sums the delayed filtered data stream with elements of the sum 109 to thereby provide an Nth one of the filtered data streams. As shown in FIG. 4, an element of this data stream is therefore y(n−4)+x(n)+x(n−1)+x(n−2)+x(n−3). It is apparent from the integrator filter 32 of FIG. 1B that y(n−4)+x(n−3)=y(n−3), that y(n−3)+x(n−2)=y(n−2), and that y(n−2)+x(n−1)=y(n−1). These equalities are successively substituted in FIG. 4 to show that the element in the Nth one of the filtered data streams is indeed y(n)=y(n−1)−x(n).

A first one of the N−1 summers 105 at the output port 108 is arranged to difference the element y(n) with the element x(n) at the first one of the input ports 107 to thereby provide elements y(n−1)=y(n)−x(n) of another of the output ports 108. It is apparent from the integrator filter 32 of FIG. 1B that the transfer function of an integrator filter can be realized by forming a current output data stream element y(n) as the sum of a current input data stream element x(n) with a delayed output data stream element y(n−1). By extension, this leads to the following series of expressions:

$$y(n) = \sum_{i=0}^{n} x(i), \ y(n-1) = \sum_{i=0}^{n-1} x(i), \ y(n-2) = \sum_{i=0}^{n-2} x(i). \tag{1}$$

From the series (1), it is also apparent that a previous output data stream element y(n−1) is given by subtracting a current input data stream element x(n) from a subsequent output data stream element y(n). Accordingly, the output of the first one of the summers 105 does indeed provide filtered data stream elements y(n−1).

In a similar manner, remaining ones of the summers 105 are arranged to difference the element y(n) with elements at respective ones of the input ports 107 to thereby provide N−2 additional ones of the filtered data streams. In particular, one of the summers 105 differences element y(n) with the sum x(n)+x(n−1) at one of the input summers 104 to thereby provide y(n)−x(n)−x(n−1) which becomes element y(n−2)=y(n−1)−x(n−1) when it is noted that y(n−1)=y(n)−x(n). This equation for y(n−2) is also consistent with the series (1).

Continuing in this manner, the other of the summers 105 differences element y(n) with the sum x(n)+x(n−1)+x(n−2) at one of the input summers 104 to thereby provide y(n−3)=y(n−2)−x(n−2) at another of the output ports 108.

From FIG. 4, it is apparent that an interleaved integrator structure embodiment of the invention generally includes:
a) a register coupled to delay an first one of N filtered data streams into a delayed filtered data stream; and
b) a network of summers arranged to:
1) sum the delayed filtered data stream with the N resampled data streams to thereby provide an Nth one of the filtered data streams; and
b) difference the Nth filtered data stream with a first one of the resampled data streams and with N−2 successive sums of a first N−1 of the resampled data streams to thereby provide the remaining ones of the filtered data streams.

More particularly, FIG. 4 shows that the network of summers includes:
a) N−1 summers 104 arranged to sum N resampled data streams into a sum data stream 109 and to successively sum N−1 of the resampled data streams into N−2 successively-summed data streams 110;
b) a summer 103 arranged to sum the delayed filtered data stream with the sum data stream to thereby provide an Nth one of the filtered data streams;
c) another summer 105 arranged to difference a first one of the resampled data streams with the Nth filtered data stream to thereby provide a first one of the filtered data streams; and
d) N−2 summers 105 arranged to each difference a respective one of the N−2 successively-summed data streams 110 with the Nth filtered data stream to thereby provide N−2 ones of the filtered data streams.

Figure 5:
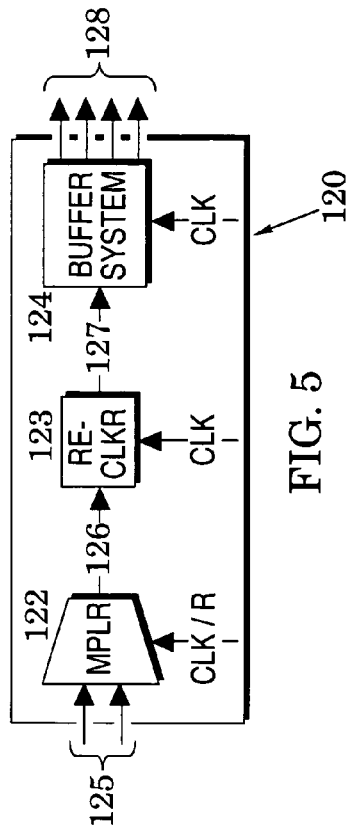
FIG. 5 is a block diagram of a resampler in the system of FIG. 2.

An embodiment 120 of the resampler 62 of FIG. 2 is shown in FIG. 5 to include a multiplexer 122, a reclocker 123, and a buffer system 125. The multiplexer 122 receives successively-delayed intermediate data streams 125 that were generated by the input filter section 61 of FIG. 2. These data streams arrive at the multiplexer with a data rate of clk/RM and the multiplexer operates at a rate of clk/R to multiplex the data into a multiplexed resampled data stream 126 having a rate of clk/R.

In one embodiment, the reclocker 123 is simply a register that receives the data stream 126 at a data rate of clk/R and is clocked at a rate of clk so that each incoming data element is clocked out R times. Accordingly, the reclocker generates a resampled data stream 127 that has a data rate of clk.

The buffer system 124 has a structure similar to the system 70 of FIG. 3A. That is, it includes registers that each receives a data stream and is clocked at a rate of clk to thereby generate a delayed version of that data stream. Accordingly, the buffer system 124 provides successively-delayed resamped data streams 128. These are, for example, the data streams represented by the elements x(n) through x(n−3) at the input ports 103 of the output filter section of FIG. 4.

The filter system 60 of FIG. 2 is configured to process an input data stream at an input data rate into an output data stream at an output data rate that exceeds the input data rate by a factor R. In this interpolation process, the system 60 uses an interleaved structure to generate the output data rate even though this rate may be higher than the rates of which the system components (e.g., summers and delay registers) are capable.

The system embodiments of the invention, however, also include interleaved structures which are arranged to perform a decimation process in which the output data rate is less than the input data rate by a factor R. In these embodiments, the comb structures 67 (each denoted with a C) of the input filter section 61 in FIG. 2 are replaced with integrator structures 68 (each denoted with an I). Similarly, the integrator structures 63 of the output filter section 63 are replaced with comb structures 67. This interchange of filter structures is indicated in FIG. 2 by a double headed interchange arrow 130.

Interleaved filter embodiments have been described which can generate output data streams with rates that exceed those of which the system components are capable. These embodiments also enhance system performance, e.g., they reduce data timing problems and, in addition, they reduce filter dissipation because they reduce the need for pipelined adder structures.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A filter system for processing an input data stream having an input data rate into an output data stream having an output data rate that is greater than said input data rate, the system comprising:
   an input filter section that processes said input data stream;
   an output filter section that provides said output data stream; and
   a resampler that couples said input filter section to said output filter section;
   wherein at least one of said input and output filter sections is configured to interleavably process its respective data stream;
   wherein said input filter section includes:
   a buffer system arranged to convert said input data stream into M successively-delayed input data streams; and
   at least one comb structure configured to interleavably process, at a rate of 1/M of said input data rate, said M successively-delayed input data streams into M intermediate data streams;
   and wherein said comb structure includes:
   a register coupled to delay a first one of said M successively-delayed input data streams into a delayed input data stream; and
   a network of summers wherein:
   a) M−1 of said summers are each arranged to difference a respective one of said M successively-delayed input data streams with the next-delayed one of said M successively-delayed input data streams to thereby provide M−1 of said M intermediate data streams; and
   b) one of said summers is arranged to difference the most-delayed one of said M successively-delayed input data streams with said delayed input data stream to thereby provide an Mth one of said intermediate data streams.

2. The system of claim 1, wherein said buffer system includes at least one register that delays said input data stream into one of said M successively-delayed input data streams.

3. The system of claim 1, wherein said at least one comb structure is four serially-coupled comb structures.

4. A filter system for processing an input data stream having an input data rate into an output data stream having an output data rate that is greater than said input data rate, the system comprising:
   an input filter section that processes said input data stream;
   an output filter section that provides said output data stream; and
   a resampler that couples said input filter section to said output filter section;
   wherein at least one of said input and output filter sections is configured to interleavably process its respective data stream;
   wherein said input filter section generates an intermediate data stream, said resampler converts said intermediate data stream into N successively-delayed resampled data streams having a rate of 1/N of said output data rate and said output filter section includes;
   at least one integrator structure configured to interleavably process said N successively-delayed resampled data streams into N filtered data streams; and
   a multiplexer that multiplexes, at said output data rate, said N filtered data streams into said output data stream;
   and wherein said integrator structure includes:
   a register coupled to delay an Nth one of said N filtered data streams into a delayed filtered data stream; and
   a network of summers arranged to:
   a) sum said delayed filtered data stream with said N resampled data streams to thereby provide an Nth one of said
   b) difference said Nth filtered data stream with a first one of said resampled data streams and with N−2 successive sums of a first N−1 of said resampled data streams to thereby provide the remaining ones of said filtered data streams.

5. The system of claim 4, wherein said at least one integrator structure is four serially-coupled integrator structures.

6. The system of claim 4, wherein said network of summers includes:
   N−1 summers arranged to sum said N resampled data streams into a sum data stream and to successively sum N−1 of said resampled data streams into N−2 successively-summed data streams;
   a summer arranged to sum said delayed filtered data stream with said sum data stream to thereby provide an Nth one of said filtered data streams;
   another summer arranged to difference a first one of said resampled data streams with said Nth filtered data stream to thereby provide a first one of said filtered data streams; and
   N−2 summers arranged to each difference a respective one of said N−2 successively-summed data streams with said Nth filtered data stream to thereby provide N−2 ones of said filtered data streams.

7. A filter system for processing an input data stream having an input data rate into an output data stream having an output data rate that is greater than said input data rate, the system comprising:
   an input filter section that processes said input data stream;
   an output filter section that provides said output data stream; and
   a resampler that couples said input filter section to said output filter section;
   wherein at least one of said input and output filter sections is configured to interleavably process its respective data stream;
   wherein said input filter section generates an intermediate data stream, said resampler converts said intermediate data stream into N successively-delayed resampled data streams having a rate of 1/N of said output data rate and said output filter section includes:
   at least one integrator structure configured to interleavably process said N successively-delayed resampled data streams into N filtered data streams; and
   a multiplexer that multiplexes, at said output data rate, said N filtered data streams into said output data stream;

wherein said intermediate data stream comprises M intermediate data streams at a rate of 1/M of said input data rate and said resampler includes:
a multiplexer that multiplexes, at said input data rate, said M intermediate data streams into a multiplexed intermediate data stream;
a register that responds to said multiplexed intermediate data stream and is clocked at said output data rate to provide a resampled data stream; and
at least one register that delays said resampled data stream into one of said N successively-delayed resampled data streams.

8. The system of claim 7, wherein M is two and N is four.

9. A filter system for processing an input data stream having an input data rate into an output data stream having an output data rate that is less than said input data rate, the system comprising:
an input filter section that processes said input data stream;
an output filter section that provides said output data stream; and
a resampler that couples said input filter section to said output filter section;
wherein at least one of said input and output filter sections is configured to interleavably process its respective data stream;
wherein said input filter section includes:
a buffer system arranged to convert said input data stream into M successively-delayed input data streams; and
at least one integrator structure configured to interleavably process said M successively-delayed input data streams into M intermediate data streams;
wherein said integrator structure includes:
a register coupled to delay an Mth one of said M intermediate data streams into a delayed filtered data stream; and
a network of summers arranged to:
a) sum said delayed filtered data stream with said M input data streams to thereby provide an Mth one of said M intermediate data streams; and
b) difference said Mth intermediate data stream with a first one of said M input data streams and with N−2 successive sums of a first N−1 of said M input data streams to thereby provide the remaining ones of said M intermediate data streams.

10. The system of claim 9, wherein said network of summers includes:
M−1 summers arranged to sum said M input data streams into a sum data stream and to successively sum M−1 of said input data streams into M−2 successively-summed data streams;
a summer arranged to sum said delayed filtered data stream with said sum data stream to thereby provide an Mth one of said intermediate data streams;
another summer arranged to difference a first one of said input data streams with said Mth intermediate data stream to thereby provide a first one of said intermediate data streams; and
M−2 summers arranged to each difference a respective one of said M−2 successively-summed data streams with said Mth intermediate data stream to thereby provide M−2 ones of said M intermediate data streams.

11. A filter system for processing an input data stream having an input data rate into an output data stream having an output data rate that is less than said input data rate, the system comprising:
an input filter section that processes said input data stream;
an output filter section that provides said output data stream; and
a resampler that couples said input filter section to said output filter section;
wherein at least one of said input and output filter sections is configured to interleavably process its respective data stream;
wherein said input filter section generates an intermediate data stream, said resampler converts said intermediate data stream into N successively-delayed resampled data streams having a rate of 1/N of said output data rate and said output filter section includes:
at least one comb structure configured to interleavably process said N successively-delayed resampled data streams into N filtered data streams; and
a multiplexer that multiplexes, at said output data rate, said N filtered data streams into said output data stream;
wherein said comb structure includes:
a register coupled to delay a first one of said N successively-delayed resampled data streams into a delayed resampled data stream; and
a network of summers wherein:
a) N−1 of said summers are each arranged to difference a respective one of said N successively-delayed resampled data streams with the next-delayed one of said N successively-delayed resampled data streams to thereby provide N−1 of said N filtered data streams; and
b) one of said summers is arranged to difference the most-delayed one of said M successively-delayed intermediate data streams with said delayed input data stream to thereby provide an Mth one of said filtered data streams.

12. The system of claim 11, wherein said at least one integrator structure is four serially-coupled integrator structures.

13. A filter system for processing an input data stream having an input data rate into an output data stream having an output data rate that is less than said input data rate, the system comprising:
an input filter section that processes said input data stream;
an output filter section that provides said output data stream; and
a resampler that couples said input filter section to said output filter section;
wherein at least one of said input and output filter sections is configured to interleavably process its respective data stream;
wherein said input filter section generates M intermediate data streams, said resampler converts said M intermediate data streams into N successively-delayed resampled data streams having a rate of 1/N of said output data rate and said output filter section includes:
at least one comb structure configured to interleavably process said N successively-delayed resampled data streams into N filtered data streams; and
a multiplexer that multiplexes, at said output data rate, said N filtered data streams into said output data stream;
wherein said resampler includes:
a multiplexer that multiplexes, at said input data rate, said M intermediate data streams into a multiplexed intermediate data stream;
a register that responds to said multiplexed intermediate data stream and is clocked at said output data rate to provide a resampled data stream; and at least one register that delays said resampled data stream into one of said N successively-delayed resampled data streams.

14. The system of claim 13, wherein M is two and N is four.

* * * * *